United States Patent [19]
Simpson

[11] Patent Number: 5,313,470
[45] Date of Patent: May 17, 1994

[54] BOUNDARY-SCAN INPUT CELL FOR A CLOCK PIN

[75] Inventor: David L. Simpson, West Columbia, S.C.

[73] Assignee: NCR Corporation, Dayton, Ohio

[21] Appl. No.: 761,126

[22] Filed: Sep. 17, 1991

[51] Int. Cl.$^5$ .............................................. H04B 17/00
[52] U.S. Cl. .................................... 371/22.3; 371/22.1
[58] Field of Search ............... 307/269, 480; 371/22.1, 371/22.3, 15.1, 22.6, 25.1, 22.5; 324/158 R

[56] References Cited

U.S. PATENT DOCUMENTS

| | | | |
|---|---|---|---|
| 4,588,944 | 5/1986 | Rothenberger | 371/22.3 |
| 4,682,329 | 7/1987 | Kluth et al. | 371/15 |
| 4,692,633 | 9/1987 | Ngai et al. | 307/269 |
| 4,912,709 | 3/1990 | Teske et al. | 371/22.1 |
| 4,945,536 | 7/1990 | Hancu | 371/22.3 |
| 4,947,357 | 8/1990 | Stewart et al. | 371/22.3 |
| 4,961,013 | 10/1990 | Obermeyer, Jr. et al. | 307/480 |
| 5,001,713 | 3/1991 | Whetsel | 371/22.3 |
| 5,027,355 | 6/1991 | Stoica | 371/22.1 |
| 5,043,985 | 8/1991 | Lin et al. | 371/22.3 |
| 5,048,021 | 9/1991 | Jarwala et al. | 371/22.3 |
| 5,109,383 | 4/1992 | Chujo | 371/22.3 |
| 5,115,191 | 5/1992 | Yoshimori | 371/22.3 X |
| 5,132,635 | 7/1992 | Kennedy | 371/22.3 X |
| 5,172,377 | 12/1992 | Robinson et al. | 371/22.3 |

*Primary Examiner*—Kevin J. Teska
*Attorney, Agent, or Firm*—Jack R. Penrod; James H. Beusse

[57] ABSTRACT

A boundary-scan circuit for a system clock input pin of an integrated circuit which prevents the transmission of undesirable pulses into the clock inputs of the core logic circuits during switching to or from the test clock. This is accomplished by synchronizing the signal that controls the switching from or to the system clock to provide such switching during the inactive portion of the system clock cycle. The boundary-scan circuit uses plural switching elements to provide sufficient current drive to prevent degradation of a rise time of any clock pulse transmitted thereby without the use of additional current buffers.

16 Claims, 2 Drawing Sheets

BOUNDARY-SCAN INPUT CELL FOR A CLOCK PIN

BACKGROUND OF THE INVENTION

The present invention relates to a boundary-scan circuit, and more particularly to a boundary-scan circuit that selects between a system clock signal received by a clock pin of an electronic device and a test clock signal.

The semiconductor industry has adopted IEEE Std. 1149.1 (1990), which is hereby incorporated by reference, in order to provide a standard test architecture. The intent of the IEEE Std. 1149.1 standard is to provide compatibility of test control and data signals between devices from different manufacturers in much the same way that compatibility within a logic family, e.g. TTL, CMOS, etc., presently exists. This standard test architecture facilitates the development of standard tests and standard test development techniques.

The standard architecture has provisions for numerous types of testing. Boundary-scan testing and built-in-self-test (BIST) testing are two of the commonly used provisions. During both boundary-scan testing and BIST testing the circuit under test often is controlled by timing pulses from a test clock, rather than the normal pulses from a system clock. Thus, the electronic device must have some type of circuit that changes from the system clock signal pulses and to test clock signal pulses during a boundary-scan or BIST test.

In normal operation, the system clock is typically received by each electronic device, e.g. an ASIC or a PLA, via a clock input pin. During a test the test clock is used for all or a portion of the test and the system clock is disconnected from the circuit unless a portion of the test requires the use of the system clock.

A problem arises, though, as the circuit under test is switched from the system clock to the test clock. The problem occurs whenever the control signal that causes the switch from the system clock to the test clock switches while one or both of the clock signals are changing states. Switch over during such a time often causes the occurrence of undesirable pulses which cause uncertain and erratic results from the circuit under test. Any switching in the time region of a logic transition of one of the clock signals can cause one or more short pulses which are too short in duration and/or amplitude to properly qualify as logic pulses. Such pulses lead to metastable oscillations in cross coupled devices and uncertain responses from other types of logic devices. Additionally, the uncertainty of the response by the circuit under test may be exacerbated by current loading of the clock switching device, which loading detrimentally affects the rise time and amplitude of short pulses.

A very similar problem of undesirable pulses arises when the circuit under test switches back from the test clock signal to the system clock signal to resume normal operation of the circuit.

Thus, it is an object of the present invention to provide a boundary-scan circuit clock input circuit that switches from a system clock signal to a test clock signal without causing undesirable pulses that cause metastable oscillations and uncertain responses in core logic circuits.

It is another object of the present invention to provide a boundary-scan circuit clock input circuit that switches from a test clock signal to a system clock signal without causing undesirable pulses that cause metastable oscillations and uncertain responses in core logic circuits.

SUMMARY OF THE INVENTION

According to one aspect of the invention, the foregoing objects are achieved by providing a boundary-scan circuit that is connected to a system clock signal via a system clock pin of an electronic device, that also includes means for synchronizing an internal test control signal to the system clock signal such that an output control signal of this synchronizing means changes in concert with a change of the system clock signal. Connected to the synchronizing means is a means for controllably switching either the system clock signal or the internal clock signal to a controllable switching means output. Connected in this manner, the control signal switches the switching means between the system clock signal and the test clock just after the system clock transitions to an inactive state.

According to another aspect of the invention, the foregoing objects of the invention are achieved by providing a boundary-scan circuit that is connected to a system clock signal via a system clock pin of an electronic device, that also includes means for synchronizing an internal test control signal to the system clock signal such that an output control signal of this synchronizing means changes in concert with a change of the system clock signal. Connected to the synchronizing means is a first means for controllably switching either the system clock signal or the internal clock signal to a first controllable switching means output. Also connected to the synchronizing means is a second means for controllably switching either said system clock signal or an internal clock signal to a second controllably switching means output. Connected in this manner, the control signal switches the first and second switching means between the system clock signal and the test clock just after the system clock transitions to a logic low state. Furthermore, the first and second controllable switching means outputs share the distribution of the selected clock signal to internal logic circuits and thereby improve the switching times of the switched signals.

BRIEF DESCRIPTION OF THE DRAWINGS

While the specification concludes with the appended claims particularly pointing out and distinctly claiming the subject matter which is regarded as the invention, it is believed that the invention will be better understood from the following detailed description of the illustrative embodiment taken in conjunction with the accompanying drawings in which FIGS. 1A and 1B when joined along their dashed lines form a block diagram of a boundary-scan circuit for a clock pin.

DETAILED DESCRIPTION OF A PREFERRED EMBODIMENT

Figure 1A:
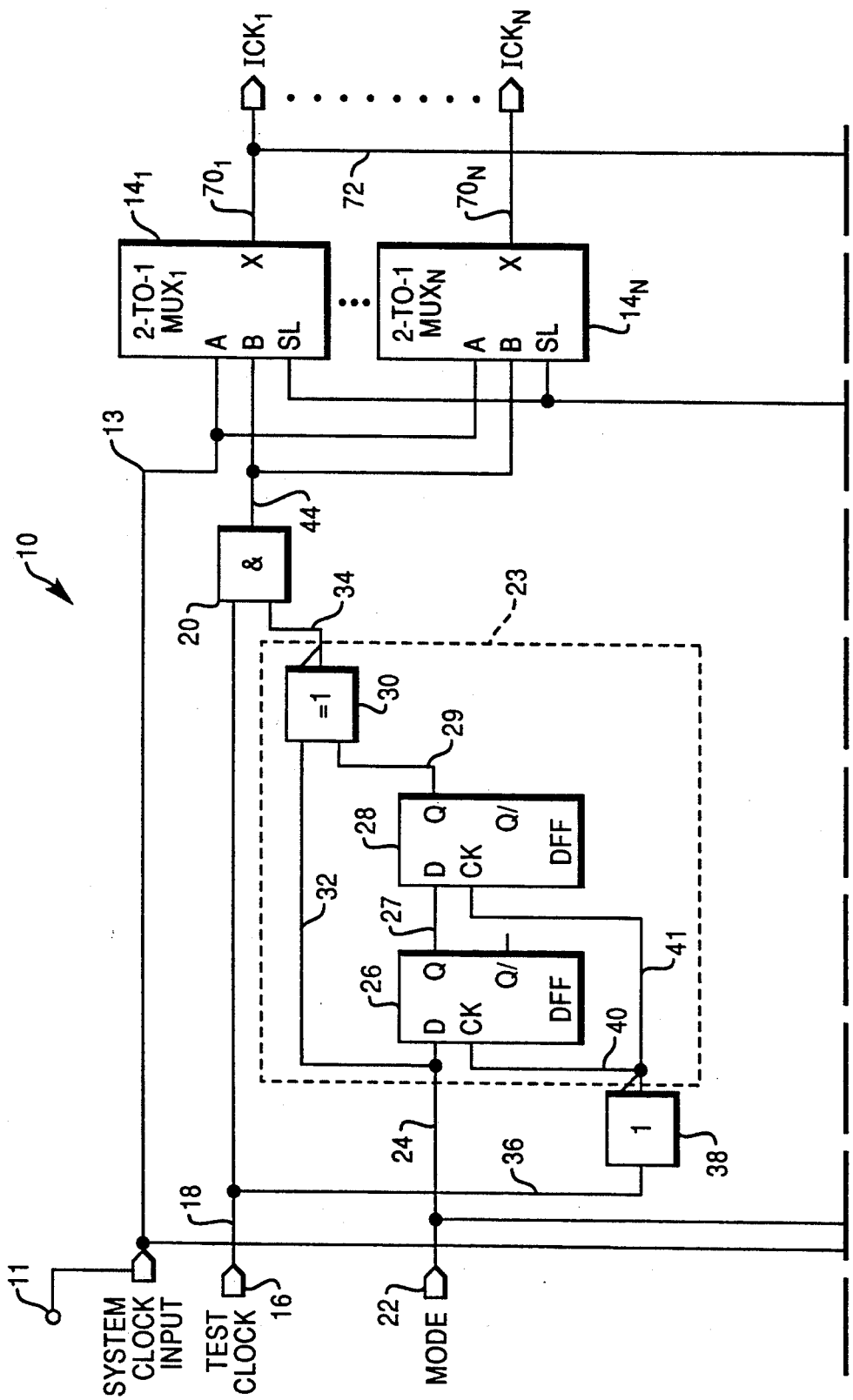
Figure 1B:
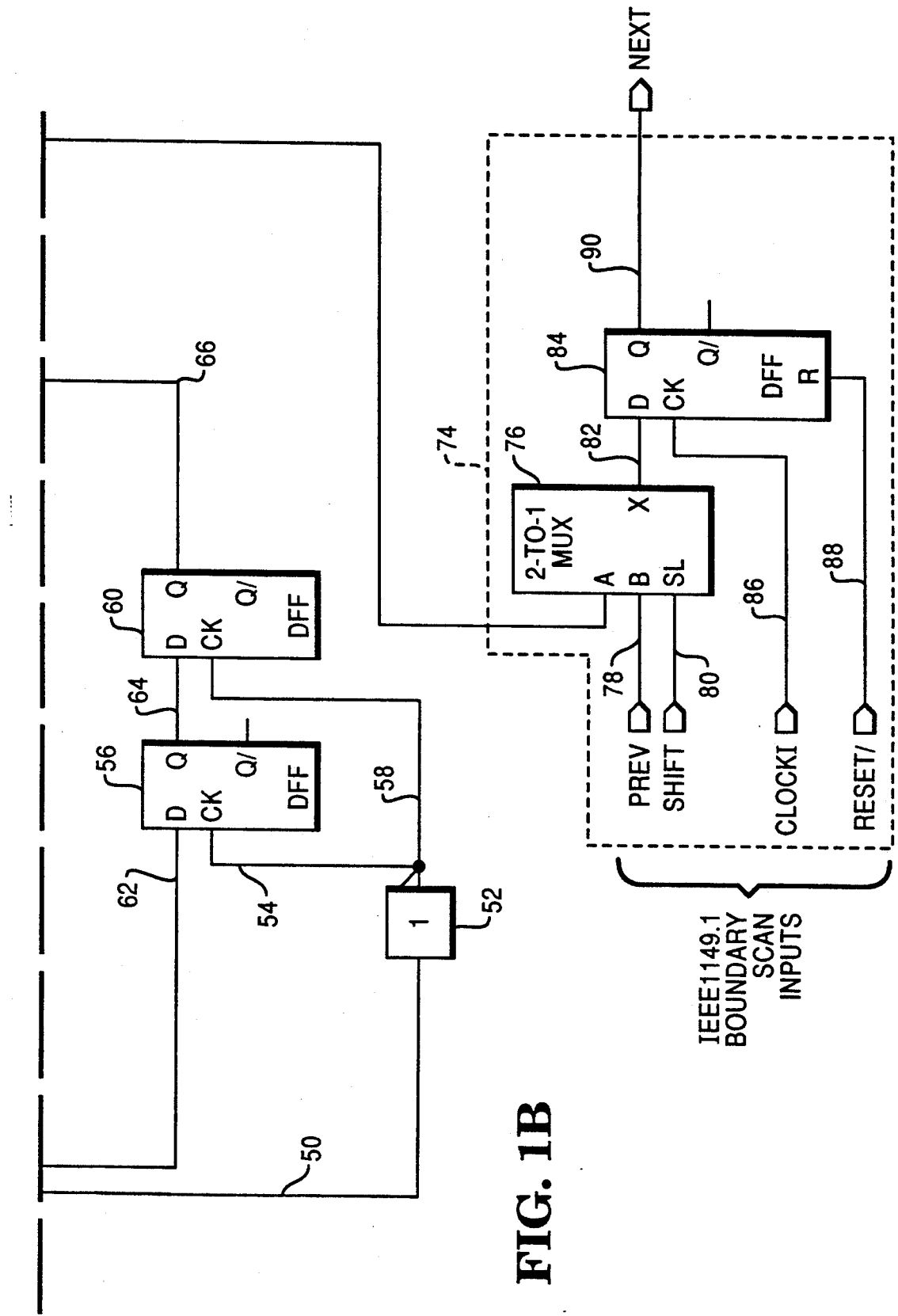

Referring to FIGS. 1A and 1B, there is shown a block diagram of a boundary-scan circuit 10 having a input pin 11 which is connected to receive a system clock signal (not shown). The system clock signal is typically a square wave with pulses that have a duty cycle of approximately fifty per cent, and may have an operating frequency of fifty megahertz or more. The system clock pin 11 is connected via line 13 to one of the data inputs of each of the 2-to-1 MUX's $14_1$–$14_N$.

A test clock terminal 16 is connected to receive a test clock signal, (not shown) which is typically a square wave with an operating frequency that is usually lower than the system clock. The test clock terminal is connected via line 18 to an input of an AND gate 20.

A mode terminal 22 is connected to a delay circuit 23 by line 24. Delay circuit 23 has a type D flip-flop 26 that has its D input connected to line 24 to receive a MODE control signal that is impressed on mode terminal 22 from a test control system (not shown). A non-inverted output of type D flip-flop 26 is connected by line 27 to a D input of another type D flip-flop 28 of the delay circuit 23. A non-inverted output of type D flip-flop 28 is connected by line 29 to an input of EXCLUSIVE NOR gate 30. A second input of EXCLUSIVE NOR gate 30 is connected by line 32 to line 24. The output of EXCLUSIVE NOR gate 30 is connected by line 34 to a second input of AND gate 20.

Line 18, which conducts the test clock signal (not shown), is connected to line 36. Line 36 conducts the test clock signal to an input of an inverter 38. The output of the inverter 38 is connected by lines 40 and 41 to the clock inputs of type D flip-flops 26 and 28 respectively. Type D flip-flops 26 and 28 are preferably edge triggered, fast logic devices, such as a type DFFPF as described in *NCR ASIC Data Book* 1989 published by NCR Corporation, Dayton, Ohio, or equivalent. Type DFFPF flip-flops are positive edge triggered types; however, those skilled in the art will recognize that a negative edge triggered type might be used if the inverter 38 is omitted.

If the MODE signal has been at the normal operating level, i.e. MODE is a logic low level, for many test clock pulses, then type D flip-flops 26 and 28 will have logic low internal states and their non-inverting outputs will be logic low levels. Thus, the MODE signal conducted by lines 24 and 32 to one input of EXCLUSIVE NOR gate 30 will be a logic low level and the output of type D flip-flop 28 to the other input of EXCLUSIVE NOR gate 30 will also be a logic low level. With its inputs both at logic low levels, the output of EXCLUSIVE NOR 30 will be a logic high level, thus logically enabling the test clock signal to propagate through the AND gate 20 to the output thereof. The output of AND gate 20 is connected by conductor 44 to the B inputs of 2-to-1 MUX's $14_1$–$14_N$. If the MODE signal changes to a logic high level, lines 24 and 32 will conduct the logic high level to EXCLUSIVE NOR gate 30 which will then have a logic high level from lines 24 and 32 and a logic low level from type D flip-flop 28. With different logic levels on its inputs, EXCLUSIVE NOR 28 will output a logic low level to AND gate 20, thereby logically disabling the test clock signal to conductor 44 and the 2-to-1 MUX's $14_1$–$14_N$. This will last for two positive going edges of the test clock, after which the MODE logic high level will be clocked through type D flip-flops 26 and 28 and the inputs to the EXCLUSIVE NOR gate 30 will again be equal and the output of the EXCLUSIVE NOR will be a logic high level again. This logic high will logically enable the test clock signal through AND gate 20 again after the delay of two positive going test clock edges.

The system clock pin 11 is also connected via line 50 to an input of an inverter 52. An output of the inverter 52 is connected via line 54 to a clock input of a type D flip-flop 56 and via line 58 to a clock input of another type D flip-flop 60. Type D flip-flops 56, 60 are preferably edge triggered, fast logic devices, such as a type DFFPF described above, or equivalent. A data input of the type D flip-flop 56 is connected via line 62 to line 24 and the MODE signal. A non-inverting output of type D flip-flop 56 is connected via line 64 to a data input of type D flip-flop 60. A non-inverting output of type D flip-flop 60 is connected via line 66 to each of the select inputs of 2-to-1 MUX's $14_1$–$14_N$.

Each of the 2-to-1 MUX's $14_1$–$14_N$ has an output that is connected via a respective line $70_1$–$70_N$ to a respective internal clock connection point $ICK_1$–$ICK_N$. The output of 2-to-1 MUX $14_1$ is also connected via lines $70_1$ and 72 to an input of a boundary-scan sub-circuit 74.

Boundary-scan sub-circuit 74 has a 2-to-1 MUX 76 which has one of its inputs connected to line 72 and receives the output of 2-to-1 MUX $14_1$ thereby. The other input of 2-to-1 MUX 76 is connected to a previous boundary-scan sub-circuit (not shown) via line 78. The select input of the 2-to-1 MUX 76 is connected via line 80 to a control signal that switches the 2-to-1 MUX 76 such that it connects the output of 2-to-1 MUX $14_1$ or the output of a previous boundary-scan sub-circuit (not shown). The output of 2-to-1 MUX 76 is connected via line 82 to a data input of a type D flip-flop 84. Type D flip-flop 84 is preferably an edge triggered logic device such as type DFFRP as described in *NCR ASIC Data Book* 1989 published by NCR Corporation, Dayton, Ohio, or equivalent. The clock input of type D flip-flop 84 is connected via line 86 to the boundary-scan clock signal, CLOCKI. The reset input of type D flip-flop 84 is connected via line 88 to the boundary-scan reset signal, RESET/, which is an active low signal. The output of type D flip-flop 84 is connected via 90 to the next boundary-scan sub-circuit (not shown).

In Operation

In normal system operation, test control signal, MODE, will be at a logic low level which means the internal test control is inactive. The system clock signal on pin 11 is always connected to the circuit 10. From pin 11 the system clock signal goes to the inverter 52 via line 50. The inverter 52 inverts the clock such that the falling edges of the system clock signal, i.e. the edges that precede the low portion of each clock period, is a positive going edge at the output of inverter 52. The output of inverter 52 is connected in parallel to the clock inputs of type D flip-flops 56 and 60. The non-inverting output of type D flip-flop 56 is connected to type D flip-flop 60 and the non-inverting output of type D flip-flop 60 is used as the control output. Thus, the MODE signal is continuously sampled and stored in type D flip-flop 56 by the falling edge of the system clock and the output of type D flip-flop 56 is sampled and stored by each falling edge of the system clock. Together flip-flops 56 and 60 act as a synchronizer to synchronize any change in the MODE control signal such that it is slightly delayed from the fall of the system clock to its inactive level. Further, because flip-flops 56 and 60 are cascaded, any undesirable pulses caused by short pulses into flip-flop 56 will have settled by the next falling clock edge when flip-flop 60 receives the sampled MODE signal.

The non-inverted output of flip-flop 60 is used to control 2-to-1 MUX's $14_1$–$14_N$. If the system clock input were connected to the B inputs of 2-to-1 MUX's $14_1$–$14_N$, then the inverted output of flip-flop 60 could be used. For normal operation, this non-inverted output is at a low level and the inputs connected to the system clock are selected. If MODE changes to a logic low level, between one and two system clock cycles later the signal connected to the select inputs of 2-to-1 MUX's $14_1$–$14_N$ changes. This select signal will inherently change from the low logic level to the high logic level just after the system clock signal has transitioned to it logic low portion of its cycle. Those skilled in the art will recognize that whenever a test is completed and the circuit 10 restored to normal operation, the select inputs of 2-to-1 MUX's $14_1$–$14_N$ again change logic levels just after a transition of the system clock to the low or inactive portion of the clock cycle. Thus, with the circuit 10, all switching changes between the system clock and the test clock will be effected while the system clock is low or inactive.

Thus, the circuit 10 avoids the possible problems encountered when the MODE control signal may switch away from the system clock at anytime by constraining any switch away from the system clock to the time period when the system clock is inactive.

This circuit 10 would not take care of the case of a short pulse caused by the test clock signal going low very soon after the 2-to-1 MUX's $14_1$–$14_N$ change over to the test clock signal on line 44. In such a case a short pulse would occur. Such a case is prevented by the delay circuit 23, described previously, which synchronizes the test clock with the MODE signal such that the test clock does not transition from a high logic level to a low logic level until two system clock cycles after any transition of the MODE signal.

To prevent degradation of marginal logic pulses to undesirable short pulses by high output current loads, the circuits used for the of 2-to-1 MUX's $14_1$–$14_N$ are of the high output drive type. The system clock must fan out to many devices in a core logic circuit. In non-boundary-scan electronic devices high current buffers are often used to prevent the drive current requirements of the core logic circuit from slowing down the response of the clock circuit. By using the 2-to-1. MUX's $14_1$–$14_N$ to perform both the switching function and the current driver function a compact boundary-scan which does not require current buffers and does not degrade even a marginal clock waveshape is provided.

The boundary-scan sub-circuit 74 has the four standard IEEE 1149.1 control signals connected to it. It can be seen that the boundary-scan sub-circuit 74 when it is in the shift mode allows a digital signal, PREV, to be inputted on line 78 and clocked by CLOCKI signal into the boundary-scan register 84, which is a type D flip-flop. From boundary-scan register 84, the shifted signal propagates to the next boundary-scan register of a chain of test registers (not shown). Conversely, when the boundary-scan sub-circuit is not in the shift mode, the 2-to-1 MUX 76 selects the output of 2-to-1 MUX $14_1$ as the signal that is inputted to the boundary-scan register 84 and samples of the test clock are outputted from the boundary-scan register 84 on line 90 during such a condition. Thus, the state of the test clock pulses may be sampled and stored in register 84 as part of a BIST or a boundary-scan test.

It will now be understood that there has been disclosed a boundary-scan input circuit for a system clock pin which provides a synchronization for the switch over control circuit such that all switches to or from the system clock occur while the system clock is inactive to reduce undesirable pulses. Further, there has been disclosed a boundary-scan circuit for a system clock pin with 2-to-1 multiplexers which provide high current driver to prevent degradation of the rise time of any clock pulse transmitted thereby. While the invention has been particularly illustrated and described with reference to a preferred embodiment thereof, it will be understood by those skilled in the art that various changes in form, details, and applications may be made therein. It is accordingly intended that the appended claims shall cover all such changes in form, details and applications which do not depart from the true spirit and scope of the invention.

I claim:

1. A logic circuit for switching between a relatively high frequency clock signal and a relatively low frequency clock signal comprising:

first input means for receiving a relatively high frequency clock signal;

second input means for receiving a relatively low frequency clock signal, each of said high frequency and low frequency clock signals being characterized by alternate logically high and logically low states;

a multiplexer having at least two signal input terminals coupled to respective ones of said first and second input means for receiving said clock signals, said multiplexer further having a control signal input terminal and an output terminal, said multiplexer being responsive to a signal applied to said control signal input terminal for selectively coupling signals applied to one of said two input terminals to said output terminal; and first synchronizer means responsive to a command to switch between said high and low frequency clock signals for coupling a control signal to said control input terminal of said multiplexer only during a time period when said high frequency clock signal is in a logically low state.

2. The circuit of claim 1 further comprising a second synchronizer which synchronizes said control signal with said low frequency clock signal and delays said low frequency clock signal from reaching said multiplexer until after said synchronized control signal reaches said control input of said multiplexer.

3. The circuit of claim 2 wherein said second synchronizer provides said low frequency clock signal to said multiplexer only when said low frequency signal is in a logically low state.

4. An input boundary-scan circuit connected for receiving a system clock signal via a system clock pin of an electronic device, comprising:

means for synchronizing an internal test control signal to a system clock signal such that an output control signal of said synchronizing means changes in concert with a change of said system clock signal; and first switching means connected for receiving said output control signal and for controllably switching either said system clock signal or a test clock signal to an output terminal thereof in response thereto.

5. An input boundary-scan circuit connected to receive a system clock signal via a system clock pin of an electronic device as set forth in claim 4, further comprising:

second switching means connected for receiving said output control signal and for controllably switching either said system clock signal or said test clock signal to an output terminal thereof in response thereto; and said output terminals of said first and second switching means sharing the distribution of the selected clock signal to internal logic circuits.

6. An input boundary-scan circuit connected to receive a system clock signal via a system clock pin of an electronic device as set forth in claim 4, further comprising:
   means connected for coupling said test clock signal to said controllable switching means and for delaying said test clock signal at least one test clock cycle.

7. An input boundary-scan circuit connected to receive a system clock signal via a system clock pin of an electronic device as set forth in claim 6, further comprising:
   second switching means connected for receiving said output control signal and for controllably switching either said system clock signal or said test clock signal to an output terminal thereof in response thereto; and
   said first and second output terminals of said first and second switching means sharing the distribution of the selected clock signal to internal logic circuits.

8. An input boundary-scan circuit connected to receive a system clock signal via a system clock pin of an electronic device as set forth in claim 7, further comprising:
   a 2-to-1 MUX having one data input terminal connected to said output terminal of said first switching means and a second data input terminal connected to receive a previous boundary scan signal, and further having a data select input terminal connected to receive a shift control signal for selectively coupling signals from one of said data input terminals to an output terminal of said MUX; and
   a first register having a data input terminal connected to said output terminal of said 2-to-1 MUX, a clock input terminal connected to receive a boundary-scan clock signal and a non-inverting output terminal for connection to a subsequent boundary-scan register; and
   said subsequent register being part of a boundary-scan test register chain.

9. An input boundary-scan circuit connected to receive a system clock signal via a system clock pin of an electronic device as set forth in claim 8, wherein said first register comprises a type D flip-flop.

10. An input boundary-scan circuit connected to receive a system clock signal via a system clock pin of a electronic device as set forth in claim 9, wherein said synchronizing means includes:
    an inverter having an input terminal and an output terminal, said input terminal being connected to said system clock pin;
    a first positive edge triggered type D flip-flop having a data input terminal connected to receive a mode control signal, and a clock input terminal connected to said inverter output terminal; and
    a second positive edge triggered type D flip-flop having a data input terminal connected to a non-inverting signal output terminal of said first positive edge triggered type D flip-flop and a clock signal input terminal connected to said inverter output terminal, said second flip-flop having a non-inverting signal output terminal connected to said first and second switching means for controllably switching between said system clock signal and said test clock signal in synchronization with said system clock.

11. An input boundary-scan circuit connected to receive a system clock signal via a system clock pin of a electronic device as set forth in claim 10, wherein said delaying means includes:
    a second inverter having an input terminal and an output terminal, said input terminal being connected to receive said test clock signal;
    a third positive edge triggered type D flip-flop having a data input terminal connected to receive said mode control signal, a clock signal input terminal connected to said inverter output terminal, and a non-inverting signal output terminal;
    a fourth positive edge triggered type D flip-flop having a data input terminal connected to said non-inverting signal output terminal of said third positive edge triggered type D flip-flop, a clock signal input terminal connected to said second inverter output terminal, and a non-inverting signal output terminal; and
    means for enabling application of said test clock signal to said MUX in response to a delayed mode signal from said output terminal of said fourth flip-flop.

12. An input boundary-scan circuit connected to receive a system clock signal via a system clock pin of an electronic device, comprising:
    means for synchronizing an internal test control signal to a system clock signal such that an output control signal of said synchronizing means changes in concert with a change of said system clock signal from a logic high state to a logic low state; and
    first switching means connected for receiving said output control signal and for controllably switching from said system clock signal to an internal clock signal as a signal output thereof.

13. An input boundary-scan circuit connected to a system clock signal via a system clock pin of an electronic device as set forth in claim 12, further comprising:
    second switching means connected for receiving said output control signal and for controllably switching from said system clock signal to said internal clock signal as an output thereof; and
    said first and second switching means sharing the distribution of the selected clock signal to internal logic circuits.

14. An input boundary-scan circuit connected to receive a system clock signal via a system clock pin of an electronic device as set forth in claim 13, further comprising:
    a 2-to-1 MUX having one data input terminal connected to receive said output of said first switching means, a second data input terminal connected to receive a previous boundary scan signal, and a selected input terminal connected to receive a shift control signal; and
    a first register having a data input terminal connected to an output terminal of said 2-to-1 MUX, a clock input terminal connected to receive a boundary-scan clock and a non-inverting output terminal for connection to a subsequent boundary-scan register, said subsequent register being part of a boundary-scan test register chain.

15. An input boundary-scan circuit connected to receive a system clock signal via a system clock pin of an electronic device as set forth in claim 14, wherein said first register is a type D flip-flop.

16. An input boundary-scan circuit connected to receive a system clock signal via a system clock pin of an electronic device as set forth in claim 15, wherein said synchronizing means includes:
   an inverter having an input terminal and an output terminal, said input terminal being connected to said system clock pin;
   a first positive edge triggered type D flip-flop having a data input terminal connected to receive a mode control signal, a clock signal input terminal connected to said inverter output terminal and a non-inverting output terminal; and
   a second positive edge triggered type D flip-flop having a data input terminal connected to said non-inverting output terminal of said positive edge triggered type D flip-flop, a clock signal input terminal connected to said inverter output terminal, and a non-inverting output terminal connected to said first and second switching means to controllably enable switching in synchronization with said system clock.

* * * * *